United States Patent
Tseng et al.

(10) Patent No.: US 9,975,757 B2
(45) Date of Patent: May 22, 2018

(54) WAFER LEVEL HERMETIC SEAL PROCESS FOR MICROELECTROMECHANICAL SYSTEMS (MEMS) DEVICES

(71) Applicant: Taiwan Semiconductor Manufacturing Co., Ltd., Hsin-Chu (TW)

(72) Inventors: Lee-Chuan Tseng, New Taipei (TW); Chung-Yen Chou, Hsinchu (TW); Shih-Chang Liu, Alian Township (TW); Yuan-Chih Hsieh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days. days.

(21) Appl. No.: 14/729,456

(22) Filed: Jun. 3, 2015

(65) Prior Publication Data
US 2016/0355394 A1 Dec. 8, 2016

(51) Int. Cl.
*B81B 7/00* (2006.01)
*B81C 3/00* (2006.01)

(52) U.S. Cl.
CPC ............ *B81B 7/0041* (2013.01); *B81C 3/001* (2013.01); *B81B 2201/0235* (2013.01); *B81B 2201/0257* (2013.01); *B81B 2201/0264* (2013.01); *B81C 2203/0109* (2013.01); *B81C 2203/019* (2013.01); *B81C 2203/0145* (2013.01)

(58) Field of Classification Search
CPC ................ B81B 7/02; B81B 2207/095; B81B 2201/025; B81B 2201/0264; B81B 7/00; G01P 15/0802; G01P 15/125; G01P 2015/0814; G01P 2015/088; H01G 5/18; H01L 28/60; G01L 9/0073; G01L 19/0092; B81C 1/00
See application file for complete search history.

(56) References Cited

U.S. PATENT DOCUMENTS

| | | | |
|---|---|---|---|
| 7,659,150 B1* | 2/2010 | Monadgemi | B81C 1/00293 257/E23.193 |
| 2004/0224091 A1* | 11/2004 | Rusu | B81C 1/00293 427/255.28 |
| 2006/0108675 A1* | 5/2006 | Colgan | B81C 1/00293 257/684 |
| 2015/0175406 A1* | 6/2015 | Lin | B81B 7/007 257/415 |

* cited by examiner

*Primary Examiner* — Lawrence-Linh T Nguyen
(74) *Attorney, Agent, or Firm* — Eschweiler & Potashnik, LLC

(57) ABSTRACT

A microelectromechanical systems (MEMS) structure with a cavity hermetically sealed using a mask layer is provided. A capping substrate is arranged over a MEMS substrate, which includes a movable element. The capping substrate includes the cavity arranged over and opening to the movable element, and includes a seal opening in fluid communication with the cavity. The mask layer is arranged over the capping substrate. The mask layer overhangs the seal opening and laterally surrounds a mask opening arranged over the seal opening. A seal layer is arranged over the mask layer and the mask opening. The seal layer is configured to hermetically seal the cavity. A method for manufacturing the MEMS structure is also provided.

19 Claims, 14 Drawing Sheets

WAFER LEVEL HERMETIC SEAL PROCESS FOR MICROELECTROMECHANICAL SYSTEMS (MEMS) DEVICES

BACKGROUND

Microelectromechanical systems (MEMS) devices, such as accelerometers, pressure sensors, and microphones, have found widespread use in many modern day electronic devices. For example, MEMS accelerometers are commonly found in automobiles (e.g., in airbag deployment systems), tablet computers, or in smart phones. For many applications, MEMS devices are electrically connected to microcontrollers, microprocessors, or application-specific integrated circuits (ASICs) to form complete MEMS systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1D illustrates a top view of some embodiments of a trench in the MEMS structure of FIG. 1A.

DETAILED DESCRIPTION

Figure 1A:
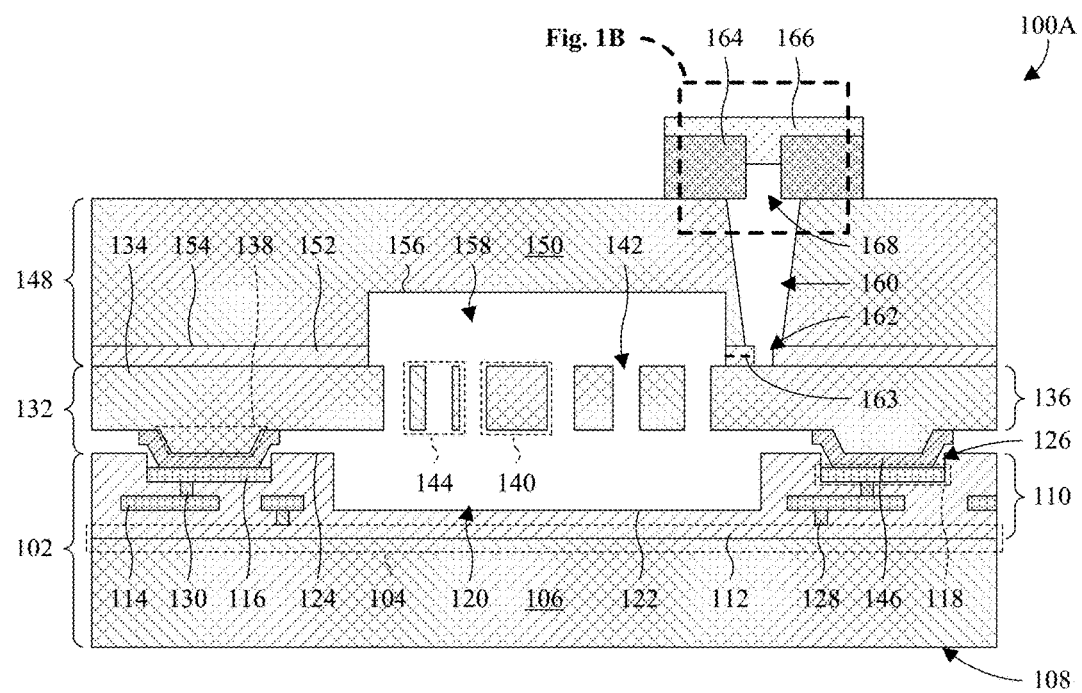
FIG. 1A illustrates a cross-sectional view of some embodiments of a microelectromechanical systems (MEMS) structure using a mask layer for sealing a cavity.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some methods for a manufacturing microelectromechanical systems (MEMS) device, a capping device is provided or otherwise formed. The capping device includes a capping substrate and a capping dielectric layer arranged on a lower surface of the capping substrate. The capping substrate and the capping dielectric layer define a cavity and a trench on a lower side of the capping device. The cavity extends vertically through the capping dielectric layer, into the capping substrate. The trench extends vertically into the capping dielectric layer, and laterally through the capping dielectric layer to the cavity. The capping device is bonded to an upper side of a MEMS substrate, and an integrated circuit is bonded to a lower side of the MEMS substrate, thereby sealing the cavity and the trench with an initial pressure.

After the capping device and the integrated circuit are bonded to the MEMS substrate, the cavity is resealed with a target pressure. This advantageously allows multiple MEMS devices with different target pressures to be formed together from the same wafers. For example, while the initial pressure may not be the target pressure for the MEMS device, the initial pressure may be the target pressure for an additional MEMS device formed together with the MEMS device. To reseal the cavity, a first etch is performed to the capping dielectric layer, through a select region of the capping substrate, to form a seal opening over the trench. The select region is selected by a mask layer that laterally surrounds the select region over the capping substrate and that is removed upon conclusion of the first etch. Further, a second etch is performed to the trench, through an exposed region of capping dielectric layer in the seal opening, to expand the seal opening and to expose the trench. With the first and second etches performed, a seal layer is formed sealing the seal opening at the target pressure, thereby resealing the cavity with the target pressure.

Challenges with the foregoing methods to forming a MEMS device follow from the first etch, and result in reduced yields. Since the first etch is typically a high aspect ratio etch (i.e., an etch forming a high aspect ratio opening), the first etch typically has a long etch time and lateral etching. The lateral etching increases the width of the seal opening beyond that of a mask opening overlying the capping substrate (i.e., the lateral etching erodes sidewalls of the capping substrate nearest the seal opening to undercut edges of the mask layer), and makes it more challenging to control the profile and the top width of the seal opening. Further, since the seal opening typically has a high aspect ratio with an enlarged top width, performing the second etch and forming the seal layer are typically more challenging. As to the former, it may be challenging applying a sufficient amount of etchant to the dielectric layer through the seal opening. As to the latter, it may be challenging forming the seal layer over the seal opening due to the enlarged top width. Further, it may be challenging forming the seal layer within the seal opening (e.g., along the bottom of the seal opening) through the seal opening.

In view of the foregoing, the present application is directed to an improved method for manufacturing a MEMS device that uses the mask layer of the first etch for resealing the cavity. Instead of removing the mask layer upon conclusion of the first etch, the mask layer is left intact for resealing the cavity. Since the mask opening has a smaller top width than the seal opening, the seal layer can be more readily formed over the mask opening without having to form the seal layer within the seal opening. This simplifies the process for resealing the cavity, and improves yield.

According to some embodiments of the improved method, a capping substrate defining a cavity on a lower side of the capping substrate is provided or otherwise formed. The capping substrate is bonded to an upper side of a MEMS substrate, and an integrated circuit is bonded to a lower side of the MEMS substrate, thereby sealing the cavity. A mask layer is formed over the capping substrate, laterally surrounding a select region of the capping substrate and a mask opening overlying the select region. In accordance with the mask layer, an etch is performed through the mask opening and the select region of the capping substrate to form a seal opening in fluid communication with the cavity. In some embodiments, the seal opening is in direct fluid communication with the cavity. In other embodiments, the seal opening is in indirect fluid communication with the cavity through a trench extending to the cavity from a point laterally adjacent to the cavity. A seal layer is then formed over the mask opening at a target pressure, thereby resealing the cavity with the target pressure.

Advantageously, any lateral etching of the capping substrate during the etch does not substantially affect the top width of the mask opening. Accordingly, the mask opening can be sized at a suitable width for sealing the seal opening over the mask opening. Further, to the extent that the seal opening interfaces with the cavity through a trench, the trench can be formed abutting the capping substrate so no additional etch is used to expose the trench after the etch. By simplifying sealing, and eliminating etching of the capping dielectric layer through the seal opening, yields can be improved and MEMS devices with different pressures can be more readily formed together.

With reference to FIG. 1A, a cross-sectional view 100A of some embodiments of a MEMS structure is provided. The MEMS structure includes an integrated circuit (IC) 102 that supports MEMS operations and is, for example, a complementary metal-oxide-semiconductor (CMOS) integrated circuit, such as an application-specific-integrated circuit (ASIC), a microprocessor, or a microcontroller, for example. The IC 102 includes a device region 104 arranged over an IC substrate 106 of the IC 102 between a lower side 108 of the IC 102 and a back-end-of-line (BEOL) metallization stack 110 of the IC 102. The device region 104 includes electronic components (not shown), such as, for example, one or more of transistors, capacitors, resistors, inductors, and diodes. The IC substrate 106 may be, for example, a bulk semiconductor substrate or a SOI substrate.

The BEOL metallization stack 110 includes an interlayer dielectric (ILD) layer 112 and metallization layers 114, 116 stacked within the ILD layer 112. The ILD layer 112 may be, for example, a low κ dielectric (i.e., a dielectric with a dielectric constant less than about 3.9) or an oxide. The metallization layers 114, 116 include an upper metallization layer 116 with an IC bond ring 118. The IC bond ring 118 laterally surrounds a IC cavity 120 defined over a surface 122 of the ILD layer 112 that is recessed relative to an upper surface 124 of the ILD layer 112. Further, in some embodiments, the IC bond ring 118 underlies a ring-shaped IC opening 126 in the ILD layer 112 that exposes the IC bond ring 118. Contacts 128 of the BEOL metallization stack 110 electrically couple the device region 104 to the metallization layers 114, 116, and vias 130 of the BEOL metallization stack 110 electrically couple the metallization layers 114, 116 to one another. The metallization layers 114, 116, the contacts 128, the vias 130, and the IC bond ring 118 may be, for example, a conductive material, such as aluminum copper, germanium, copper, tungsten, or some other metal.

A MEMS device 132 is arranged over and bonded to the IC 102. The MEMS device 132 may be, for example, a motion sensor, a pressure sensor, or a microphone. The MEMS device 132 includes a MEMS substrate 134. The MEMS substrate 134 may be, for example, a bulk semiconductor substrate, a SOI substrate, or a polysilicon-on-insulator (POI) substrate. The MEMS substrate 134 includes a base region 136 and a ring-shaped mounting region 138. The base region 136 has a movable or flexible element 140 (e.g., a proof mass) arranged over the IC cavity 120. Further, the base region 136 typically has a substantially uniform thickness, and/or one or more MEMS openings 142 defining the movable or flexible element 140. In some embodiments, the MEMS opening(s) 142 further define a spring 144 suspending the movable or flexible element 140 over the IC cavity 120. The ring-shaped mounting region 138 protrudes from the base region 136 towards the IC 102, and vertically aligns with the IC bond ring 118. Further, the ring-shaped mounting region 138 laterally surrounds the IC cavity 120, and is lined by a MEMS bond ring 146. The MEMS bond ring 146 is electrically coupled with the IC bond ring 118 and, in some embodiments, extends into the ring-shaped IC opening 126 in the ILD layer 112. The MEMS bond ring 146 is or otherwise includes, for example, aluminum copper, copper, germanium, or some other metal.

During operation of the MEMS device 132, the movable or flexible element 140 deflects in proportion to external stimuli, such as motion or sound waves, applied to the movable or flexible element 140. As such, the external stimuli can be quantified by measuring the deflection. In some embodiments, the deflection is measured using capacitive coupling between the movable or flexible element 140 and sensing electrodes (not shown) arranged along the recessed surface 122 of the ILD layer 112. In such embodiments, the movable or flexible element 140 may be electrically coupled to the IC 102 (e.g., through the MEMS bond ring 146).

A capping device 148 is arranged over and bonded to the MEMS device 132. The capping device 148 includes a capping substrate 150 and a capping dielectric layer 152 lining a lower surface 154 of the capping substrate 150. The capping substrate 150 has a surface 156 that is recessed relative to the lower surface 154 and that overlies a capping cavity 158. The capping cavity 158 is vertically aligned with the IC cavity 120 over the movable or flexible element 140 and, in some embodiments, is in fluid communication with the IC cavity 120 (e.g., through the MEMS opening(s) 142). The capping substrate 150 also has a seal opening 160 extending through the capping substrate 150 to the capping dielectric layer 152, laterally adjacent to the capping cavity 158. The capping substrate 150 may be, for example, a bulk semiconductor substrate or an SOI substrate. The capping dielectric layer 152 spaces the capping substrate 150 from the MEMS device 132, and laterally surrounds the capping cavity 158. Further, the capping dielectric layer 152 has a trench 162 underlying the seal opening 160. The trench 162 extends vertically through the capping dielectric layer 152. Further, the trench 162 extends laterally through the capping dielectric layer 152 to the capping cavity 158, such that the trench 162 is in fluid communication with capping cavity 158 along a fluid path 163. The capping dielectric layer 152 may be, for example, an oxide, such as silicon dioxide.

Although not shown, in some embodiments, an anti-stiction layer lines surfaces of the IC and/or capping cavities 120, 158, and/or surfaces of the MEMS device 132. The anti-stiction layer advantageously prevents stiction of the movable or flexible element 140 during operation of the MEMS device 132. Typically, the anti-stiction layer is a conformal self-assembled monolayer (SAM), but other anti-stiction layers are amenable.

A mask layer 164 is arranged over the capping substrate 150 around the periphery of the seal opening 160, and a seal layer 166 is arranged over the mask layer 164. The mask layer 164 overhangs the seal opening 160, and includes a mask opening 168 overlying the seal opening 160. The mask opening 168 has a smaller footprint than the seal opening 160, and is typically centered vertically on a center of the seal opening 160. The seal layer 166 plugs the mask opening 168 to hermetically seal the capping cavity 158 (and, in some embodiments, the IC cavity 120), and typically shares a footprint with the mask layer 164. Further, the seal layer 166 partially fills the mask opening 168. The mask and seal layers 164, 166 may be, for example, a dielectric, such as silicon dioxide, some other oxide, silicon nitride, or some other nitride.

Figure 1B:
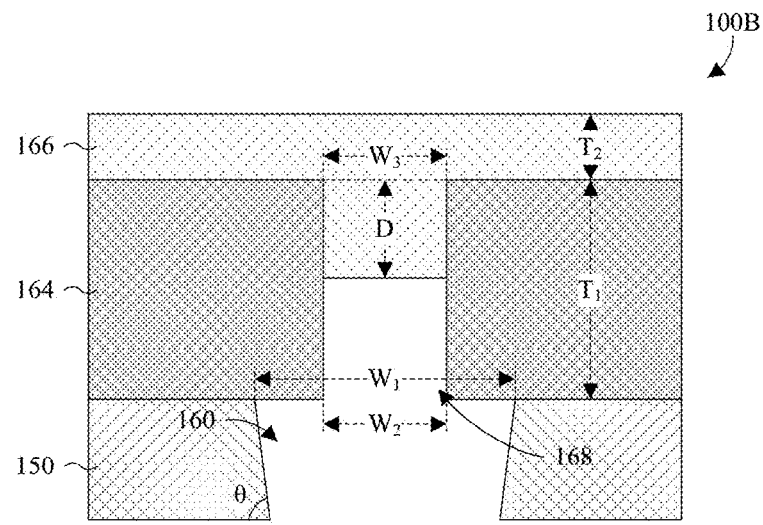
FIG. 1B illustrates an enlarged cross-sectional view of some embodiments of the mask layer of FIG. 1A.

With reference to FIG. 1B, an enlarged cross-sectional view 100B of some embodiments of the seal and mask openings 160, 168 is provided. The seal opening 160 underlies the mask opening 168 within the capping substrate 150. The seal opening 160 has a ratio of height (i.e., distance between the top and the bottom) to top width $W_1$ typically exceeding about 30. In some embodiments, the height of the seal opening 160 is about 160 micrometers to about 200 micrometers, such as about 175 or 180 micrometers. In some embodiments, the top width $W_1$ of the seal opening 160 is about 3 to about 5 micrometers, such as about 3.94 or 3.80 micrometers. Further, the seal opening 160 has a width tapering from the seal opening top width $W_1$. In some embodiments, a sidewall surface of the seal opening 160 has an angle θ of about 75 degrees to about 90 degrees, relative to the lower surface 154 (see FIG. 1A) of the capping substrate 150.

The mask opening 168 overlies the seal opening 160 within the mask layer 164. In some embodiments, the mask layer 164 has a thickness $T_1$ of about 0.1 micrometers to about 5.0 micrometers, such as about 2.4 micrometers or such as about 2.0 micrometers to about 3.0 micrometers. The mask opening 168 has a substantially uniform width or otherwise a width tapering to a bottom width $W_2$, and is typically centered vertically over a center of the seal opening 160. In some embodiments, the mask opening bottom width $W_2$ is about 0.5 micrometers to about 5.0 micrometers, such as about 1.4 micrometers or such as about 2.0 micrometers to about 3.0 micrometers. The mask opening bottom width $W_2$ is less than the seal opening top width $W_1$, such that the mask layer 164 overhangs the seal opening 160. In some embodiments, the extent of the overhang (e.g., the lateral distance between neighboring sidewall surfaces of the mask and seal openings 160, 168, and/or half the difference between the seal opening top width $W_1$ and the mask opening bottom width $W_2$) is about 0.2 micrometers to about 5.0 micrometers, such as about 2.5 micrometers.

The seal layer 166 covers the mask layer 164 to hermetically seal the seal opening 160. The seal layer 166 has a thickness $T_2$ that is typically no less than half a top width $W_3$ of the mask opening 168. In some embodiments, the seal layer thickness $T_2$ is about 0.25 micrometers to about 2.5 micrometers, such as about 1.25 micrometers. Further, the seal layer 166 shares a footprint with the mask layer 164, and is centered on a center of the mask layer 164. Beyond covering the mask layer 164, the seal layer 166 at least partially fills the mask opening 168. The depth D to which the seal layer 166 fills the mask opening 168 depends upon the mask opening top width $W_3$ and the seal layer thickness $T_2$. In some embodiments, where the mask opening top width $W_3$ is about 0.5 micrometers to about 2.0 micrometers, the depth D is about 0.0 micrometers to about 2.0 micrometers. In some embodiments, where the mask opening top width $W_3$ is about 2.0 micrometers to about 4.0 micrometers, the depth D is about 0.5 micrometers to about 4.0 micrometers. In some embodiments, where the mask opening top width $W_3$ is about 4.0 micrometers to about 5.0 micrometers, the depth D is about 2.0 micrometers to about 5.0 micrometers.

Figure 1C:
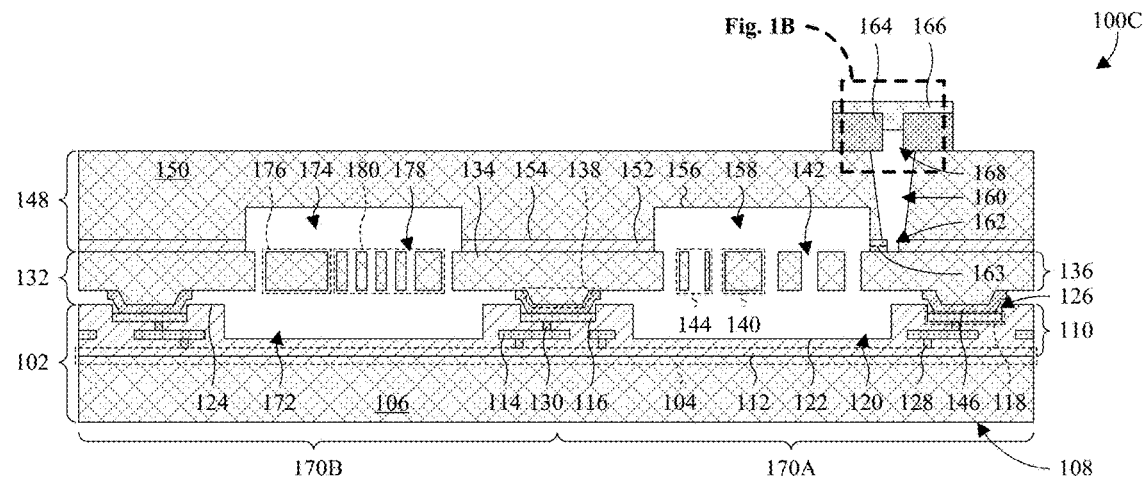
FIG. 1C illustrates an expanded cross-sectional view of some embodiments of the MEMS structure of FIG. 1A with an additional cavity.

With reference to FIG. 1C, an expanded cross-sectional view 100C of some embodiments of the MEMS structure is provided. The MEMS structure includes a first sensing region 170A and a second sensing region 170B integrated together around a common MEMS device 132. The first sensing region 170A was described above with regard to FIGS. 1A & B, and may be configured as, for example, a motion sensor, a pressure sensor, or a microphone. The second sensing region 170B neighbors the first sensing region 170A. Further, the second sensing region 170B may be configured as, for example, a motion sensor, a pressure sensor, or a microphone. However, the second sensing region 170B may be of a different different type or structure than the first sensing region 170A.

The second sensing region 170B includes a second IC cavity 172 and a second capping cavity 174 arranged vertically between the capping device 148 and the IC 102. The second capping cavity 174 has a different pressure than the capping cavity 158. Similarly, in some embodiments, the second IC cavity 172 has a different pressure than the IC cavity 120. As will be seen, the pressures of the capping cavities 158, 174 may be initially set to the same pressure when the IC 102, the MEMS device 132, and the capping device 148 are bonded together. The seal opening 160 advantageously allows the pressure of the capping cavity 158 to be changed after it is initially sealed. Arranged within the second capping and IC cavities 172, 174, the MEMS substrate 134 includes a second movable or flexible element 176. The second movable or flexible element 176 is typically defined by one or more second MEMS openings 178 in the base region 136 of the MEMS substrate 134. In some embodiments, the second MEMS opening(s) 178 further define a spring 180 suspending the movable or flexible element 176 between the second capping and IC cavities 172, 174.

While the first and second sensing regions 170A, 170B are described above as being integrated together around a common MEMS device 132, in alternative embodiments the first and second sensing regions 170A, 170B may be independent. For example, during the bulk manufacture of MEMS devices and before dicing, the first and second sensing regions 170A, 170B may correspond to independent MEMS devices arranged on a common wafer. Further, while the above discussion was limited to first and second sensing regions 170A, 170B, it is to be appreciated that additional sensing regions are amenable. For example, during the bulk manufacture of MEMS device and before dicing, sensing regions arranged on a common wafer may have different pressures than other sensing regions. These different pressures may advantageously be achieved using seal openings sealed by mask and seal layers.

With reference to FIG. 1D, a top view of some embodiments of the trench 162 is provided. As illustrated, the trench 162 extends laterally through the capping dielectric layer 152 to the capping cavity 158, such that the trench 162 is in fluid communication with the capping cavity 158. Further, as illustrated, the seal opening 160 is in indirect fluid communication with the capping cavity 158 through the trench 162.

Figure 2A:
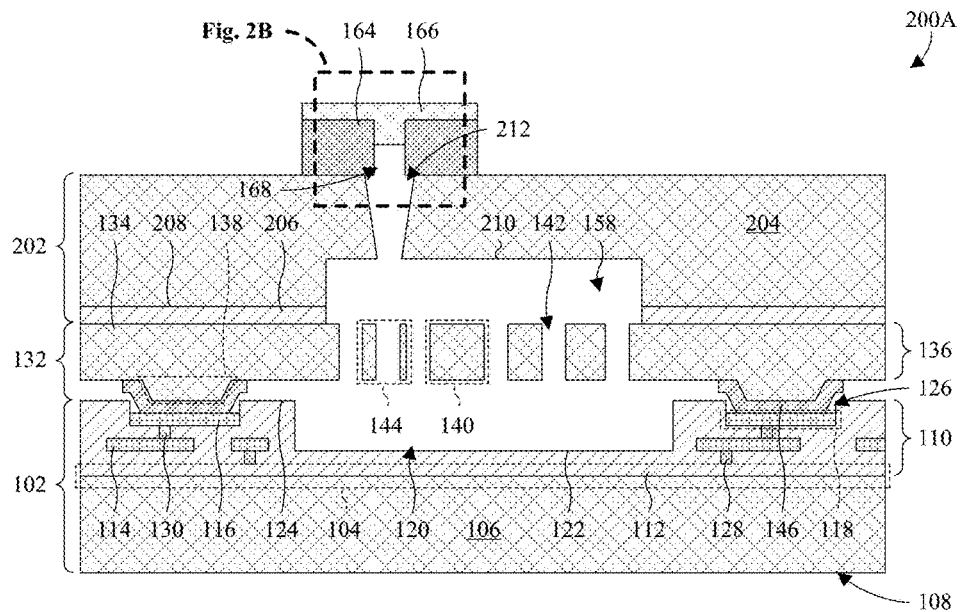
FIG. 2A illustrates a cross-sectional view of other embodiments of a MEMS structure using an mask layer for sealing a cavity.

With reference to FIG. 2A, a cross-sectional view 200A of some other embodiments of the MEMS structure is provided. In contrast with the embodiments of FIG. 1A, no trench is employed to seal the capping cavity 158 (and, in some embodiments, the IC cavity 120). Rather, the MEMS structure includes an alternative capping device 202 without a trench. The capping device 202 is laterally arranged over and bonded to the MEMS device 132. The capping device 202 includes a capping substrate 204 and a capping dielectric layer 206 lining a lower surface 208 of the capping substrate 204. The capping substrate 204 has a surface 210 recessed relative to the lower surface 208 and overlying the capping cavity 158. Further, the capping substrate 204 has a seal opening 212 extending through the capping substrate 204 directly to the capping cavity 158. The capping substrate 204 may be, for example, a bulk semiconductor substrate or an SOI substrate. The capping dielectric layer 206 spaces the capping substrate 204 from the MEMS device 132, and laterally surrounds the capping cavity 158. The capping dielectric layer 206 may be, for example, an oxide, such as silicon dioxide.

A mask layer 164 is arranged over the capping substrate 204 around the periphery of the seal opening 212, and the seal layer 166 is arranged over the mask layer 164. The mask layer 164 overhangs the seal opening 212 with the mask opening 168 overlying the seal opening 212. The mask opening 168 has a smaller footprint than the seal opening 212, and is typically centered vertically on a center of the seal opening 212. The seal layer 166 plugs the mask opening 168 to hermetically seal the capping cavity 158, and typically shares a footprint with the mask layer 164. Further, the seal layer 166 partially fills the mask opening 168.

Figure 2B:
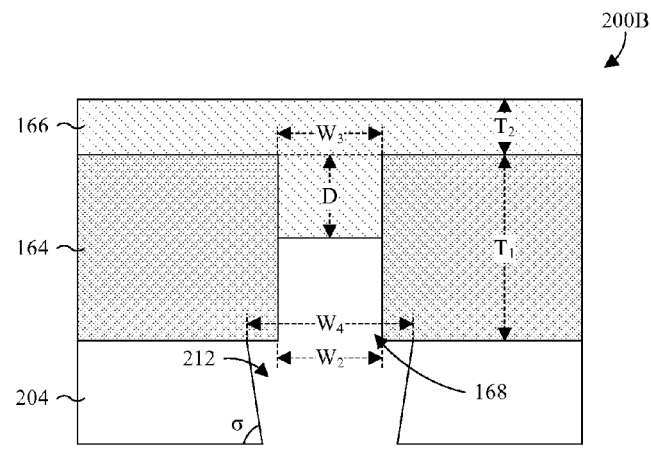
FIG. 2B illustrates an enlarged cross-sectional view of some embodiments of the mask layer of FIG. 2A.

With reference to FIG. 2B, an enlarged cross-sectional view 200B of some embodiments of the seal and mask openings 168, 212 is provided. The seal opening 212 underlies the mask opening 168 within the capping substrate 204. The seal opening 212 has a ratio of height to top width $W_4$ typically exceeding about 30. In some embodiments, the height of the seal opening 212 is about 160 micrometers to about 200 micrometers. In some embodiments, the top width $W_4$ of the seal opening 212 is about 3 micrometers to about 5 micrometers. Further, the seal opening 212 has a width tapering from the top width $W_4$. In some embodiments, a sidewall surface of the seal opening 212 has an angle σ of about 75 degrees to about 90 degrees, relative to the lower surface 208 (see FIG. 2A) of the capping substrate 204. The mask opening 168 overlies the seal opening 212 within the mask layer 164. The mask opening bottom width $W_2$ is less than the seal opening top width $W_4$, such that the mask layer 164 overhangs the seal opening 212. In some embodiments, the extent of the overhang is about 0.2 micrometers to about 5.0 micrometers.

Figure 2C:
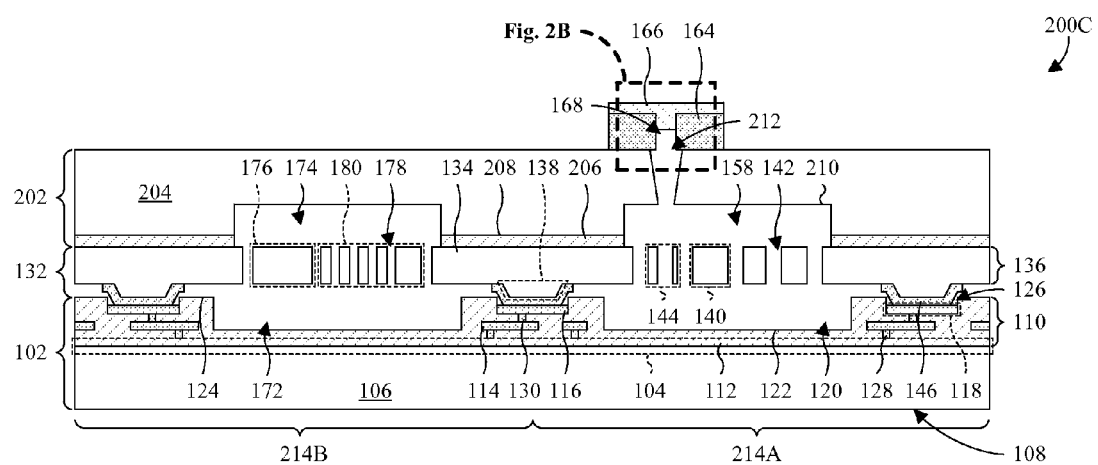
FIG. 2C illustrates an expanded cross-sectional view of some embodiments of the MEMS structure of FIG. 2A with an additional cavity.

With reference to FIG. 2C, an expanded cross-sectional view 200C of some embodiments of the MEMS structure is provided. The MEMS structure includes a first sensing region 214A and a second sensing region 214B integrated together around a common MEMS device 132. The first sensing region 214A was described above with regard to FIGS. 2A & B, and may be configured as, for example, a motion sensor, a pressure sensor, or a microphone. The second sensing region 214B neighbors the first sensing region 214A. Further, the second sensing region 214B may be configured as, for example, a motion sensor, a pressure sensor, or a microphone. However, the second sensing region 214B may be of a different different type or structure than the first sensing region 214A.

While the first and second sensing regions 214A, 214B are described above as being integrated together around a common MEMS device 132, in alternative embodiments the first and second sensing regions 214A, 214B may be independent. For example, during the bulk manufacture of MEMS devices and before dicing, the first and second sensing regions 214A, 214B may correspond to independent MEMS devices arranged on a common wafer. Further, while the above discussion was limited to first and second sensing regions 214A, 214B, it is to be appreciated that additional sensing regions are amenable. For example, during the bulk manufacture of MEMS device and before dicing, sensing regions arranged on a common wafer may have different pressures than other sensing regions.

Figure 3:
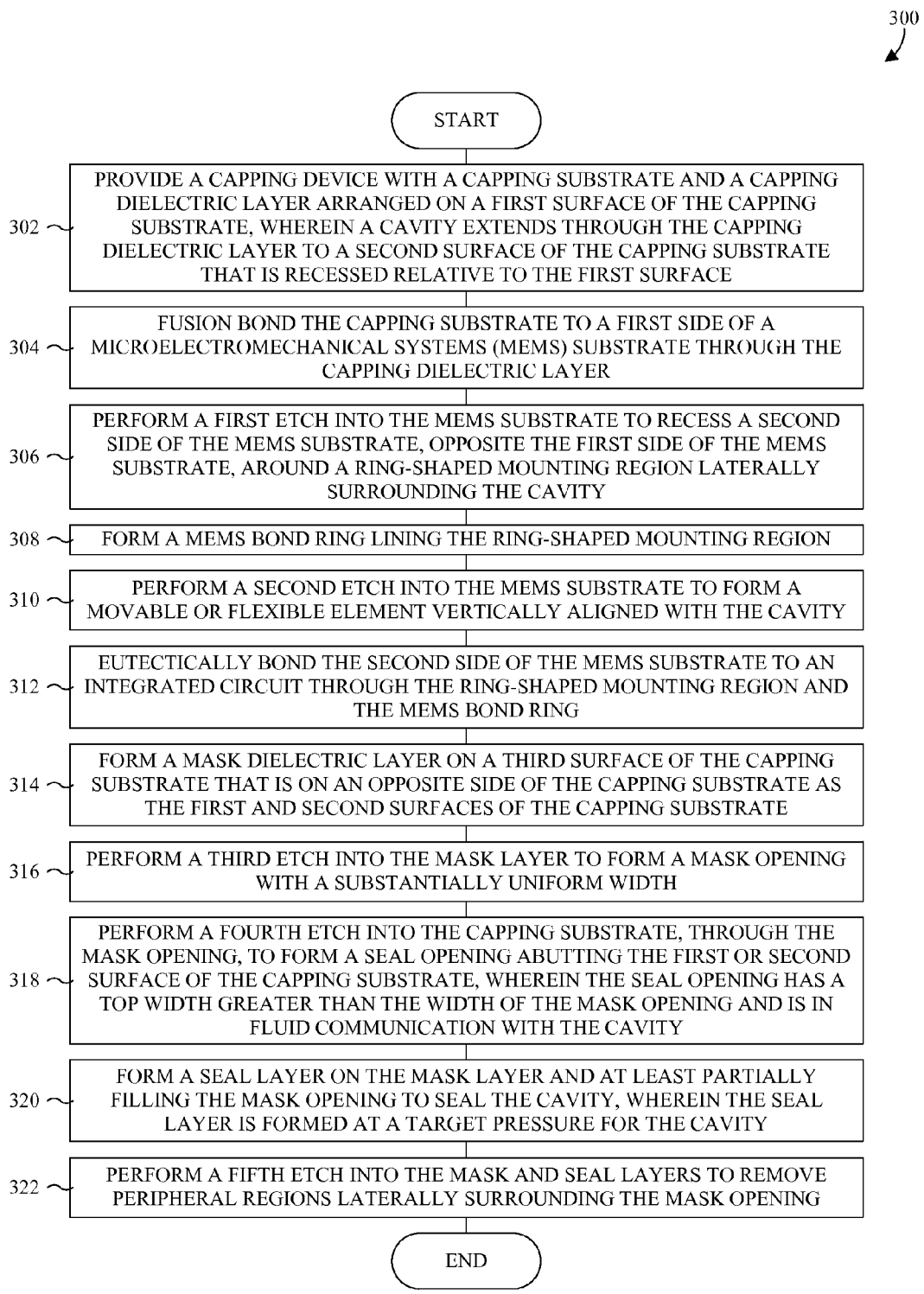
FIG. 3 illustrates a flowchart of some embodiments of a method for manufacturing a MEMS structure, in which a mask layer is used for sealing a cavity.

With reference to FIG. 3, a flowchart 300 provides some embodiments of a method for manufacturing a MEMS structure, in which a mask layer is used for sealing a cavity.

At 302, a capping device is provided or otherwise formed. The capping device includes a capping substrate and a capping dielectric layer arranged on a first surface of the capping substrate. A cavity extends through the capping dielectric layer to a second surface of the capping substrate that is recessed relative to the first surface.

At 304, the capping substrate is fusion bonded to a first side of a MEMS substrate through the capping dielectric layer.

At 306, a first etch is performed into the MEMS substrate to recess a second side of the MEMS substrate, opposite the first side of the MEMS substrate, around a ring-shaped mounting region laterally surrounding the cavity.

At 308, a MEMS bond ring is formed lining the ring-shaped mounting region.

At 310, a second etch is performed into the MEMS substrate to form a movable or flexible element vertically aligned with the cavity.

At 312, the second side of the MEMS substrate is eutectically bonded to an IC through the ring-shaped mounting region and the MEMS bond ring.

At 314, a mask layer is formed on a third surface of the capping substrate that is on an opposite side of the capping substrate as the first and second surfaces of the capping substrate.

At 316, a third etch is performed into the mask layer to form a mask opening with a substantially uniform width.

At 318, a fourth etch is performed into the capping substrate, through the mask opening, to form a seal opening abutting the first or second surface of the capping substrate. The seal opening has a top width greater than the width of the mask opening and is in fluid communication with the cavity.

At 320, a seal layer is formed on the mask layer and at least partially filling the mask opening to hermetically seal the cavity. The seal layer is formed at a target pressure for the cavity, thereby sealing the cavity at the target pressure.

At 322, a fifth etch is performed into the mask and seal layers to remove peripheral regions laterally surrounding the mask opening.

Forming the seal layer over the mask layer advantageously allows the cavity to be more readily sealed. The mask opening can be sized without regard for lateral etching that occurs during the fourth etch. This, in turn, allows the mask opening to be sized narrow enough to form the seal layer over the mask opening without having to fill or line the seal opening. As discussed above, filling or lining the seal opening may be challenging given that the seal opening typically has a high aspect ratio.

Further, forming the seal layer over the mask layer advantageously facilitates wafer level sealing of the MEMS device and the bulk manufacture of MEMS devices with different target pressures. MEMS devices can be formed together according to Acts 302-312 using common wafers. Thereafter, seal layers and mask layers can be formed according to Acts 314-322 to seal the MEMS devices with corresponding target pressures. For example, first seal and mask layers can be formed to seal a first subset of the MEMS devices with a first target pressure. Further, second seal and mask layer can be formed to seal a second subset of the MEMS devices with a second target pressure. With the MEMS devices sealed with target pressures, the common wafers can be diced to separate the MEMS devices.

While the disclosed method (e.g., the method described by the flowchart 300) is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 4-14, 15A-D, and 16A-D, cross-sectional views of some embodiments of a MEMS structure at various stages of manufacture are provided to illustrate the method of FIG. 3. Although FIGS. 4-14, 15A-D, and 16A-D are described in relation to the method, it will be appreciated that the structures disclosed in FIGS. 4-14, 15A-D, and 16A-D are not limited to the method, but instead may stand alone as structures independent of the method. Similarly, although the method is described in relation to FIGS. 4-14, 15A-D, and 16A-D, it will be appreciated that the method is not limited to the structures disclosed in FIGS. 4-14, 15A-D, and 16A-D, but instead may stand alone independent of the structures disclosed in FIGS. 4-14, 15A-D, and 16A-D.

Figure 4:
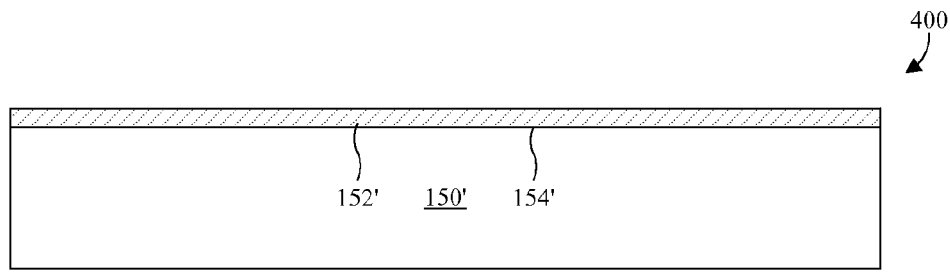
FIGS. 4-14, 15A-D, and 16A-D illustrate a series of cross-sectional views of some embodiments of a MEMS structure at various stages of manufacture, according to FIG. 3.
Figure 5:
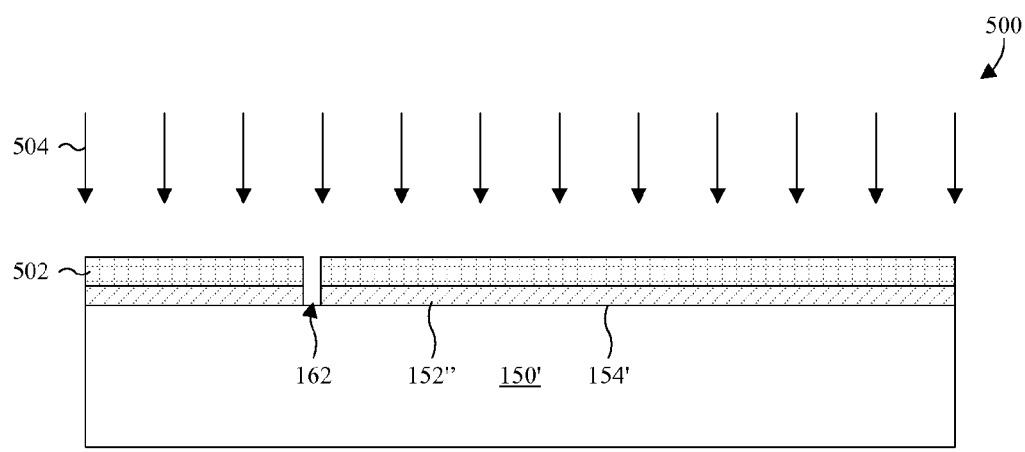
Figure 6:
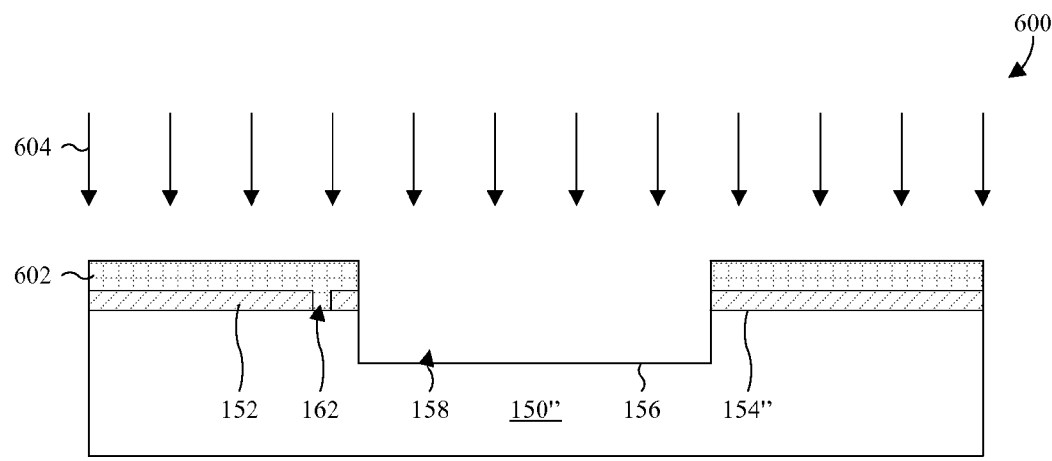

FIGS. 4-6 illustrate cross-sectional views 400, 500, 600 of some embodiments corresponding to Act 302.

As illustrated by FIG. 4, a capping substrate 150' is provided. The capping substrate 150' may be, for example, a bulk semiconductor substrate or a SOI substrate. Further, the capping substrate 150' may have a thickness of, for example, about 160 micrometers to about 200 micrometers, such as about 175 or 180 micrometers.

Also illustrated by FIG. 4, a capping dielectric layer 152' is formed over the capping substrate 150', lining a first surface 154' of the capping substrate 150'. The capping dielectric layer 152' may be formed using vapor deposition (e.g., chemical vapor deposition (CVD)), thermal oxidation, spin coating, or any other suitable deposition technique. Further, the capping dielectric layer 152' may be formed as, for example, an oxide, such as silicon dioxide.

As illustrated by FIG. 5, in some embodiments, a first etch is performed into the capping dielectric layer 152' (see FIG. 4), through a select trench region of the capping dielectric layer 152'. The first etch results in a remaining capping dielectric layer 152" with a trench 162. The trench 162 extends laterally through the remaining capping dielectric layer 152", and vertically through the remaining capping dielectric layer 152". The process for performing the first etch may include forming a first photoresist layer 502 masking regions of the capping dielectric layer 152' laterally surrounding the select trench region. Further, an etchant 504 may be applied to the capping dielectric layer 152' according to a pattern of the first photoresist layer 502. Thereafter, the first photoresist layer 502 may be removed.

As illustrated by FIG. 6, a second etch is performed into the capping dielectric layer 152" (see FIG. 5) and the capping substrate 150' (see FIG. 5), through select cavity regions of the capping dielectric layer 152" and the capping substrate 150'. The second etch results in a capping cavity 158 defined along a second surface 156 of the remaining capping substrate 150'" that is recessed relative to a first surface 154" of the remaining capping substrate 150". Further, to the extent that the trench 162 is formed, the capping cavity 158 abuts the trench 162. The process for performing the second etch may include forming a second photoresist layer 602 masking regions of the capping dielectric layer 152" and the capping substrate 150' laterally surrounding the select cavity regions. Further, one or more etchants 604 may be applied to the capping dielectric layer 152" and the capping substrate 150' according to a pattern of the second photoresist layer 602. Thereafter, the second photoresist layer 602 may be removed.

Figure 7:
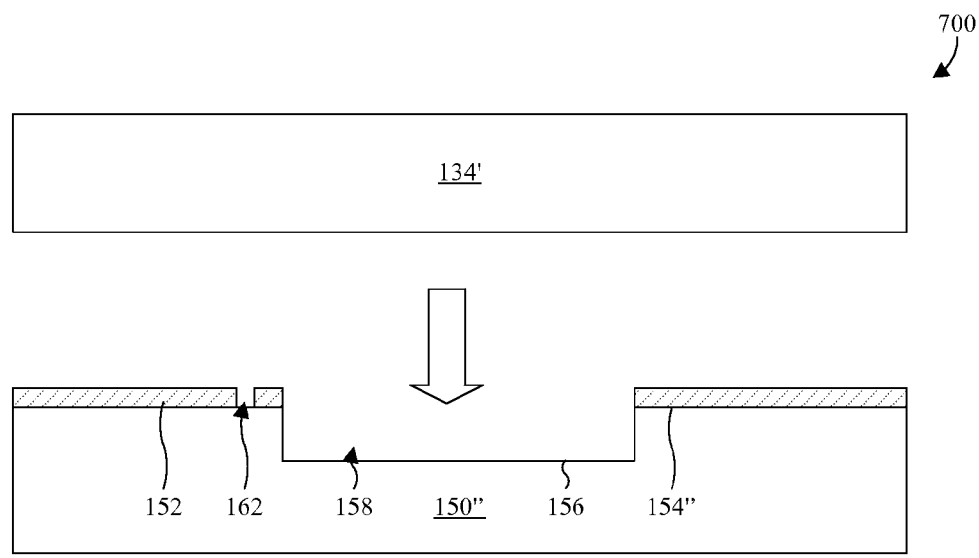

FIG. 7 illustrates a cross-sectional view 700 of some embodiments corresponding to Act 304. As illustrated, a MEMS substrate 134' is provided and bonded to the capping substrate 150" through the capping dielectric layer 152. The bonding seals the capping cavity 158 and, in some embodiments, the trench 162. The process for bonding the MEMS substrate 134' to the capping substrate 150" typically includes a fusion bonding process.

Figure 8:
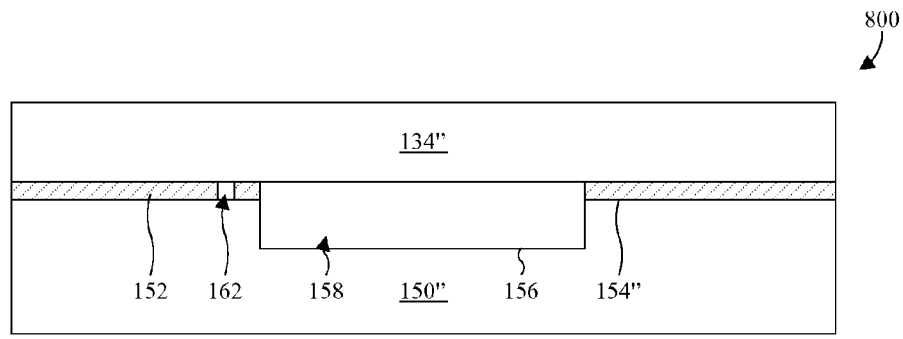
Figure 9:
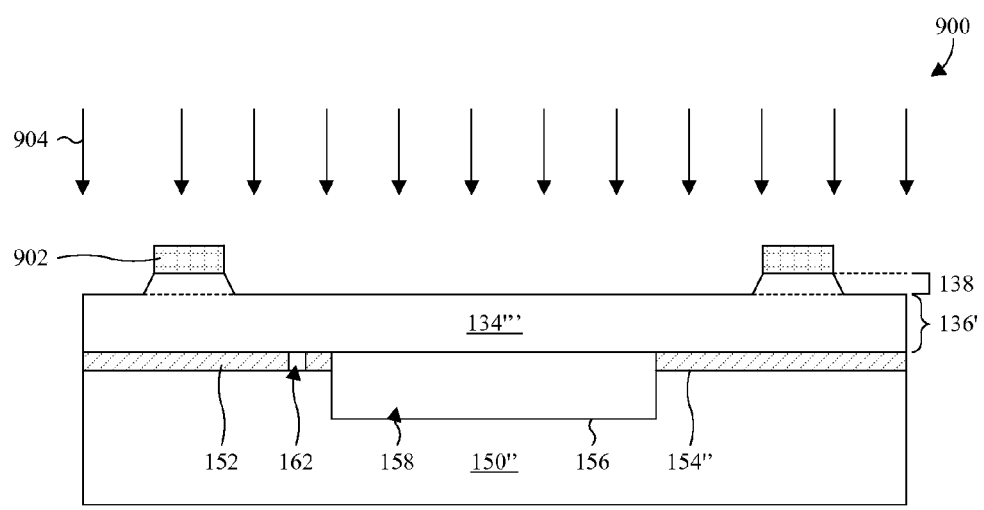

FIGS. 8 and 9 illustrate cross-sectional views 800, 900 of some embodiments corresponding to Act 306.

As illustrated by FIG. 8, in some embodiments, a thinning process is performed to reduce a thickness of the MEMS substrate 134' (see FIG. 7). The thinning process results in a thinner MEMS substrate 134" with a thickness targeted for a MEMS device under manufacture. The thinning process may include, for example, a chemical mechanical polish (CMP) process.

As illustrated by FIG. 9, a third etch is performed into the MEMS substrate 134" (see FIG. 8), through a select region, to recess the MEMS substrate 134" around a ring-shaped mounting region 138. The third etch results in a remaining MEMS substrate 134''' with a base region 136' and the ring-shaped mounting region 138 protruding from the base region 136'. The base and ring-shaped mounting regions 136', 138 typically have substantially uniform thicknesses, and the ring-shaped mounting region 138 laterally surrounds the capping cavity 158. In some embodiments, a width of the ring-shaped mounting region 138 tapers away from the base region 136'. The process for performing the third etch may include forming a third photoresist layer 902 masking the ring-shaped mounting region 138. Further, an etchant 904 may be applied to the MEMS substrate 134" according to a pattern of the third photoresist layer 902. Thereafter, the third photoresist layer 902 may be removed.

Figure 10:
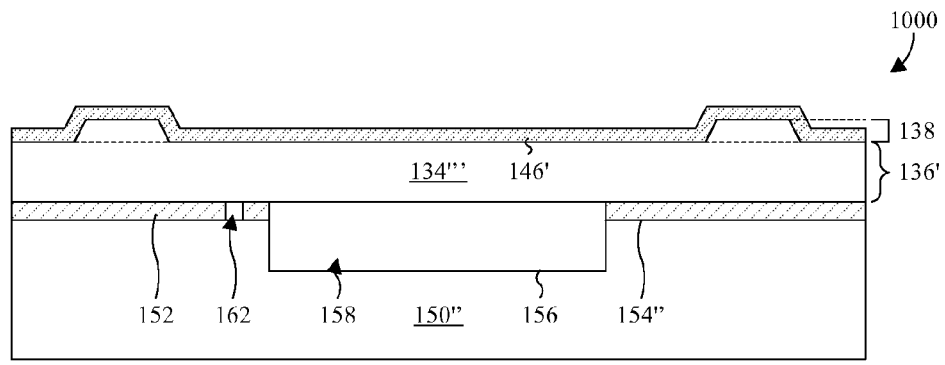
Figure 11:
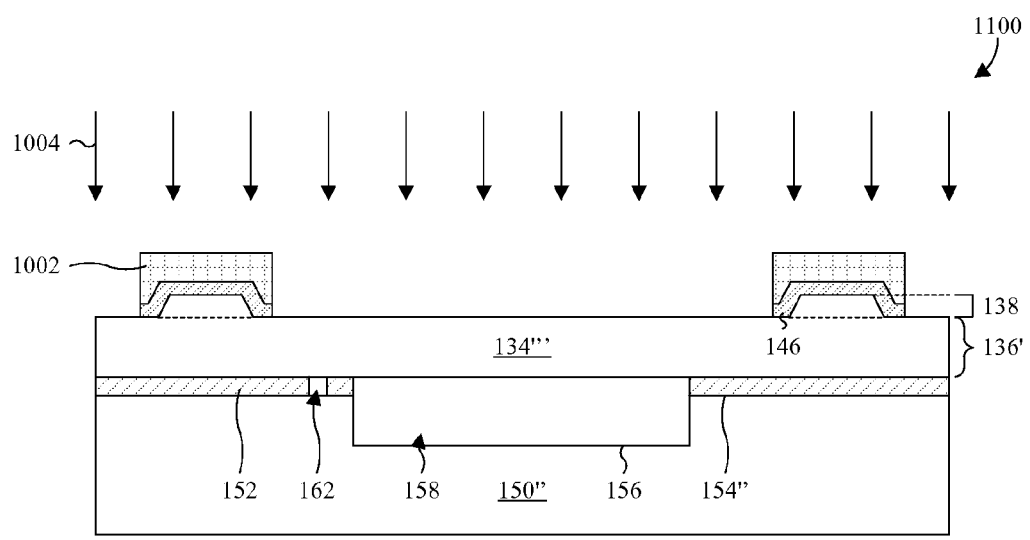

FIGS. 10 and 11 illustrate cross-sectional views 1000, 1100 of some embodiments corresponding to Act 308.

As illustrated by FIG. 10, a MEMS bond ring layer 146' is formed over the base region 136' and lining the ring-shaped mounting region 138. The MEMS bond ring layer 146' may be formed using vapor deposition, thermal oxidation, spin coating, or any other suitable deposition technique. However, the MEMS bond ring layer 146' is typically formed conformally. The MEMS bond ring layer 146' may be formed as, for example, a metal, such as aluminum copper or germanium.

As illustrated by FIG. 11, a fourth etch is performed into the MEMS bond ring layer 146' (see FIG. 10), through select regions laterally spaced from the ring-shaped mounting region 138, to remove these select regions. The fourth etch results in a MEMS bond ring 146 confined to the vicinity of the ring-shaped mounting region 138 (e.g., laterally spaced from the ring-shaped mounting region 138 by no more than 10% of the ring-shaped mounting region width). The process for performing the fourth etch may include forming a fourth photoresist layer 1102 masking the ring-shaped mounting region 138. Further, an etchant 1104 may be applied to the MEMS bond ring layer 146' according to a pattern of the fourth photoresist layer 1102. Thereafter, the fourth photoresist layer 1102 may be removed.

Figure 12:
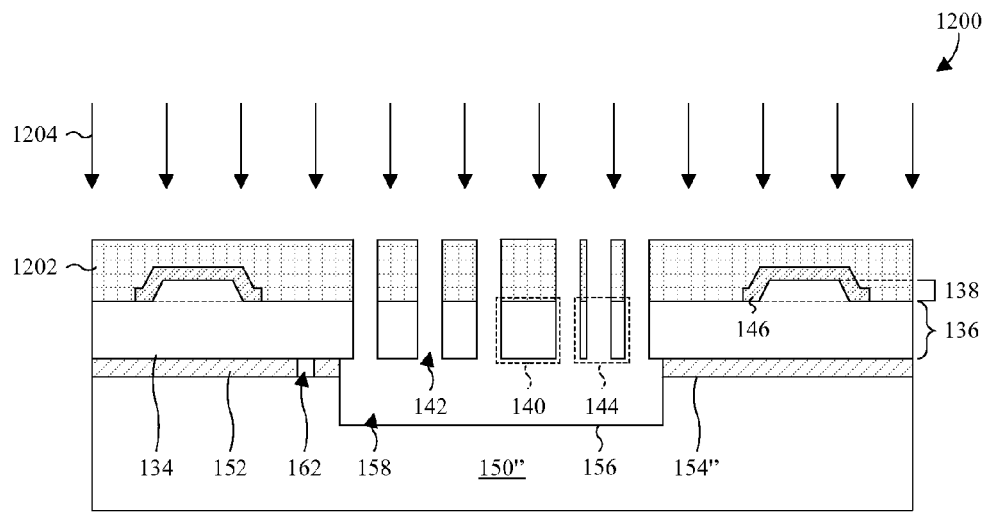

FIG. 12 illustrates a cross-sectional view 1200 of some embodiments corresponding to Act 310. As illustrated by FIG. 12, a fifth etch is performed into the MEMS substrate 134''' (see FIG. 11), through select regions overlying the capping cavity 158. The fifth etch results in a remaining MEMS substrate 134 having a base region 136 with one or more MEMS openings 142. The MEMS opening(s) 142 define a movable or flexible element 140 vertically aligned with the capping cavity 158. Further, in some embodiments, the MEMS opening(s) 142 define a spring 144 suspending the movable or flexible element 140, and/or open the capping cavity 158. The process for performing the fifth etch may include forming a fifth photoresist layer 1202 masking regions of the MEMS substrate 134''' laterally surrounding the select regions. Further, an etchant 1204 may be applied to the MEMS substrate 134''' according to a pattern of the fifth photoresist layer 1202. Thereafter, the fifth photoresist layer 1202 may be removed.

Although not shown, in some embodiments, an anti-stiction layer may be formed lining surfaces of the capping cavity 158, and/or surfaces of the remaining MEMS substrate 134. The anti-stiction layer advantageously prevents stiction of the movable or flexible element 140 during operation of the MEMS device under manufacture. The anti-stiction layer may be formed as, for example, a conformal SAM.

Figure 13:
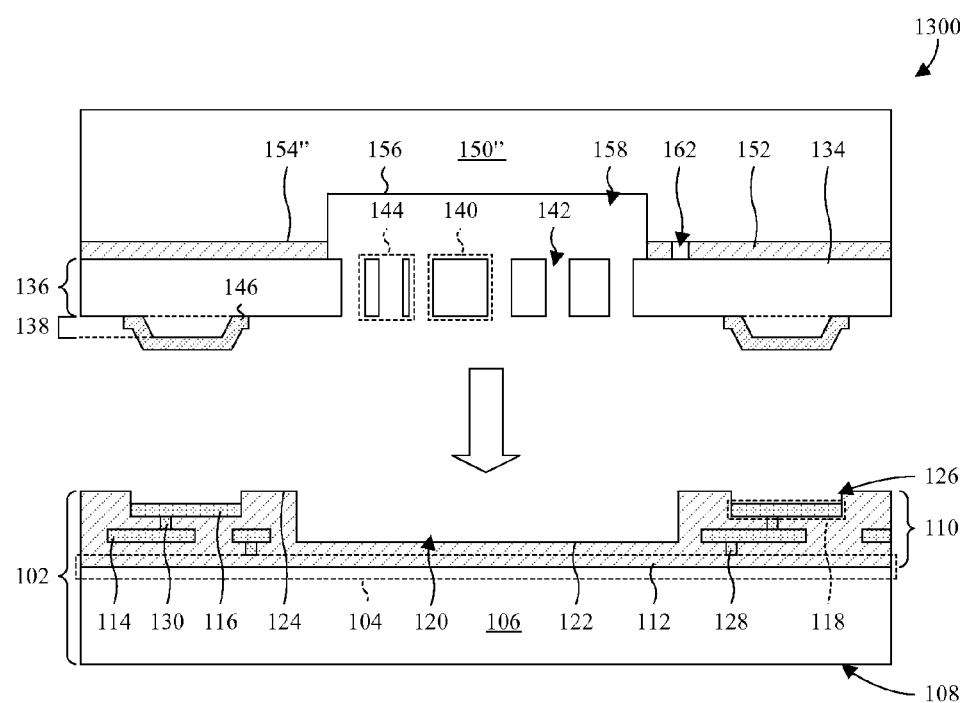

FIG. 13 illustrates a cross-sectional view 1300 of some embodiments corresponding to Act 312. As illustrated, an IC 102 is provided with a device region 104 arranged over an IC substrate 106 of the IC 102 between a lower side 108 of the IC 102 and a BEOL metallization stack 110 of the IC 102. The BEOL metallization stack 110 includes an ILD layer 112 and metallization layers 114, 116 stacked within the ILD layer 112. The metallization layers 114, 116 include an upper metallization layer 116 with an IC bond ring 118. The IC bond ring 118 laterally surrounds a IC cavity 120 defined over a surface 122 of the ILD layer 112 that is recessed relative to an upper surface 124 of the ILD layer 112. Further, in some embodiments, the IC bond ring 118 underlies a ring-shaped IC opening 126 in the ILD layer 112 that exposes the IC bond ring 118. Contacts 128 of the BEOL metallization stack 110 electrically couple the device region 104 to the metallization layers 114, 116, and vias 130 of the BEOL metallization stack 110 electrically couple the metallization layers 114, 116 to one another.

Also illustrated, the IC 102 is bonded to the MEMS substrate 134 through the IC bond ring 118 and the ring-shaped mounting region 138. The bonding seals the IC and capping cavities 120, 158. The process for bonding the MEMS substrate 134 to the IC 102 typically includes a eutectic bonding process.

Figure 14:
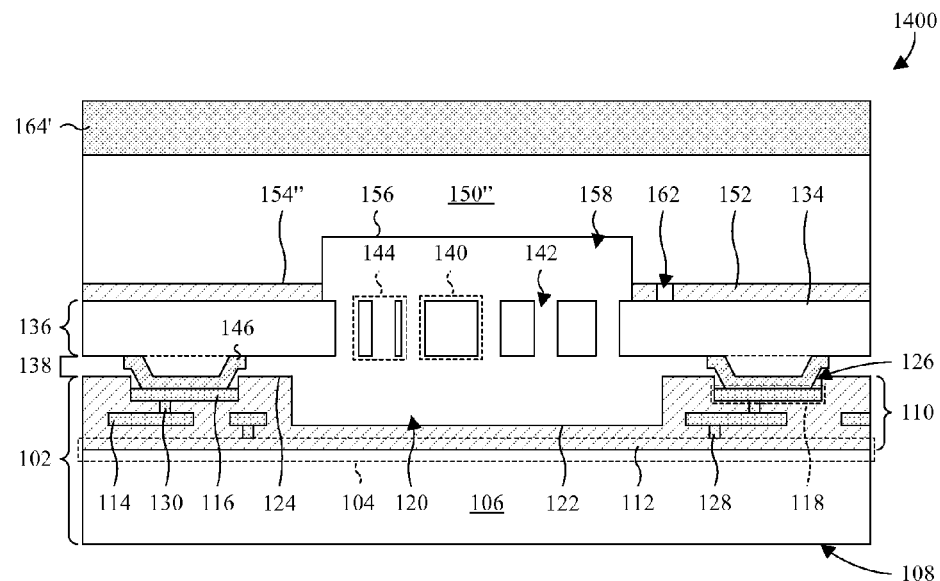

FIG. 14 illustrates a cross-sectional view 1400 of some embodiments corresponding to Act 314. As illustrated, a mask layer 164' is formed over the capping substrate 150''. The mask layer 164' may be formed using vapor deposition, thermal oxidation, spin coating, or any other suitable deposition technique. The mask layer 164' may be formed as, for example, a dielectric, such as silicon dioxide, some other oxide, silicon nitride, or some other nitride. Further, the mask layer 164' may be formed with, for example, a thickness of about 0.1 micrometers to about 5.0 micrometers, such as about 2.4 micrometers.

FIGS. 15A-D illustrate cross-sectional views 1500A-D of some embodiments corresponding to Acts 316-322. The cross-sectional views 1500A-D illustrate the formation of MEMS structures according to FIGS. 1A-C, in which a seal opening is in indirect fluid communication with a cavity being sealed.

Figure 15A:
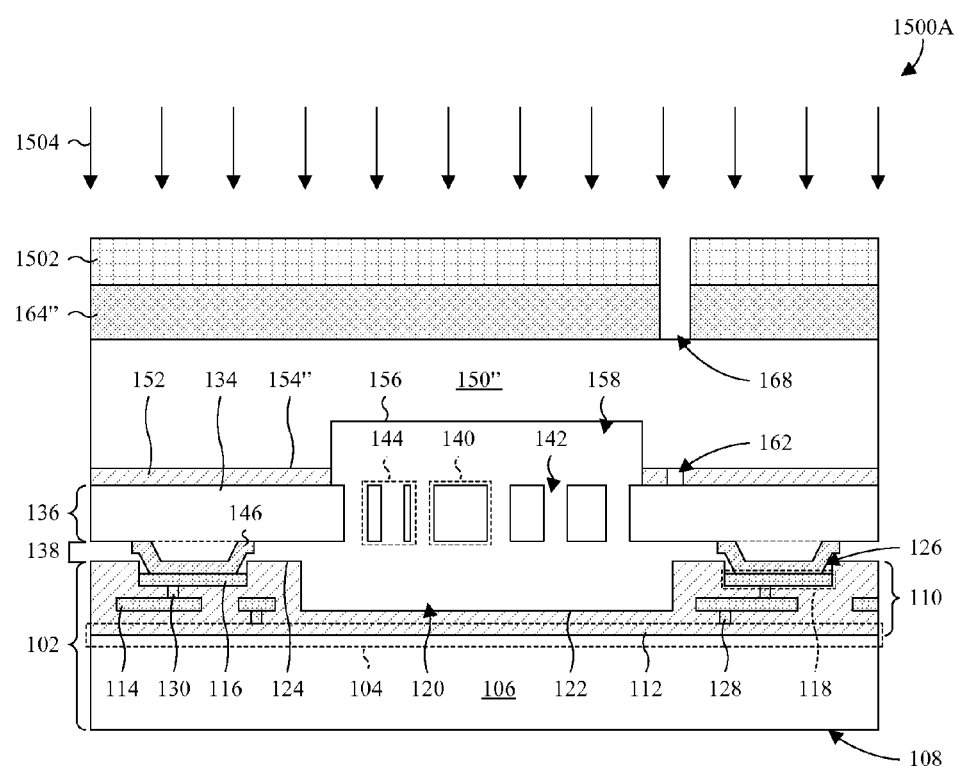

FIG. 15A illustrates a cross-sectional view 1500A of some embodiments corresponding to Act 316. As illustrated, a sixth etch is performed into the mask layer 164' (see FIG. 14), through a select region of the mask layer 164' laterally adjacent to the capping cavity 158. The sixth etch results in a remaining mask layer 164'' with a mask opening 168 exposing a seal opening region of the capping substrate 150'' that overlies the trench 162. The mask opening 168 is sized to facilitate the formation of a seal layer over the mask opening 168, and has a substantially uniform width or a width tapering towards the IC 102. In some embodiments, the mask opening 168 is formed with a top width of about 0.5 micrometers to about 5.0 micrometers. The process for performing the sixth etch may include forming a sixth photoresist layer 1502 masking regions of the mask layer 164' that laterally surrounding the seal opening region. Further, an etchant 1504 may be applied to the mask layer 164' according to a pattern of the sixth photoresist layer 1502. Thereafter, the sixth photoresist layer 1502 may be removed.

Figure 15B:
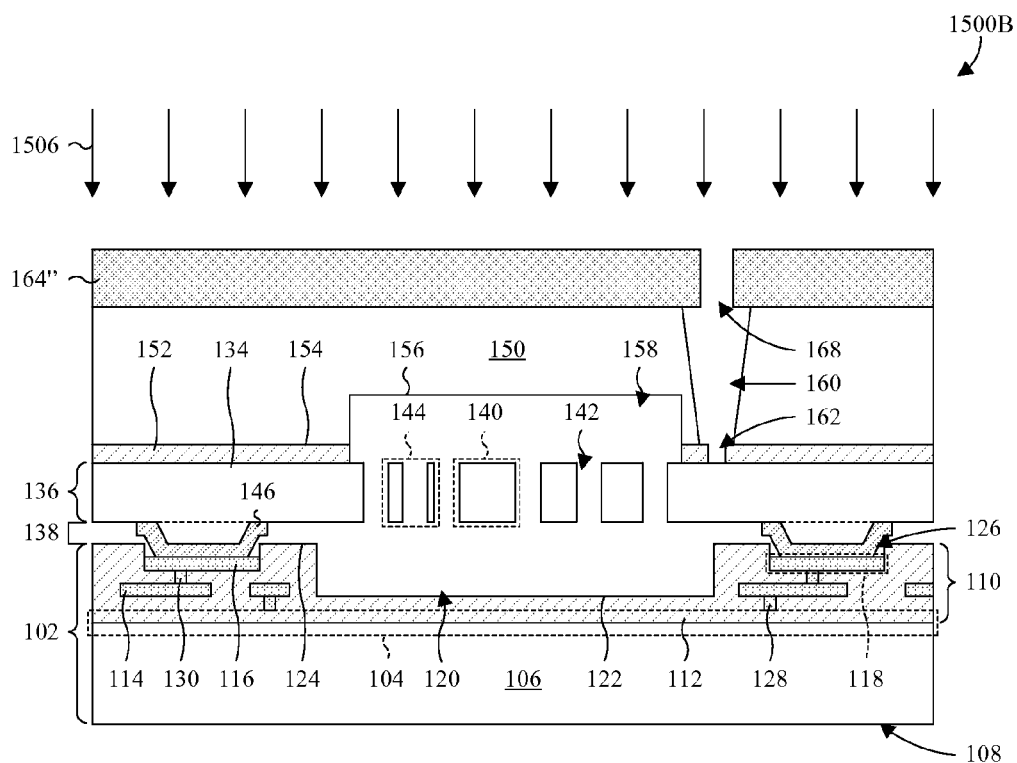

FIG. 15B illustrates a cross-sectional view 1500B of some embodiments corresponding to Act 318. As illustrated, a seventh etch is performed into the capping substrate 150'' (see FIG. 15A), through the seal opening region, to expose the trench 162. Advantageously, since the trench 162 extends vertically through the capping dielectric layer 152 (as opposed to extending vertically to a point within the remaining capping dielectric layer 152''), the seventh etch may be confined to the capping substrate 150'''.

The seventh etch results in a remaining capping substrate 150 with a seal opening 160 overlying and exposing the trench 162. The seal opening 160 is formed with a ratio of height to top width typically exceeding about 30. In some embodiments, the height of the seal opening 160 is about 160 micrometers to about 200 micrometers. In some embodiments, the top width of the seal opening 160 is about 3 to about 5 micrometers. The seal opening 160 is also formed with a width tapering from the top width. In some embodiments, a sidewall surface of the seal opening 160 has an angle of about 75 degrees to about 90 degrees, relative to a first surface 154 of the capping substrate 150. The top width of the seal opening 160 is formed greater than the bottom width of the mask opening 168, such that the mask layer 164" overhangs the seal opening 160. In some embodiments, the extent of the overhang is about 0.2 micrometers to about 5.0 micrometers.

The process for performing the seventh etch may include applying an etchant 1506 to the capping substrate 150" according to a pattern of the mask layer 164" and through the mask opening 168. Hence, the mask layer 164" acts as a mask for the duration of the seventh etch. The etchant 1506 may be selective of the capping substrate 150", relative to the mask layer 164", so the mask layer 164" is minimally affected by the seventh etch. For example, where the capping substrate 150" is silicon and the mask layer 164" is an oxide, a high selectivity etch recipe (e.g., an etch recipe with a selectivity of at least 100) may be used. Because of the high aspect ratio of the seal opening 160, lateral etching of the capping substrate 150" occurs while applying the etchant 1506. The lateral etching enlarges the top width of the seal opening 160 beyond the mask opening bottom width, thereby creating the overhang of the mask layer 164".

Figure 15C:
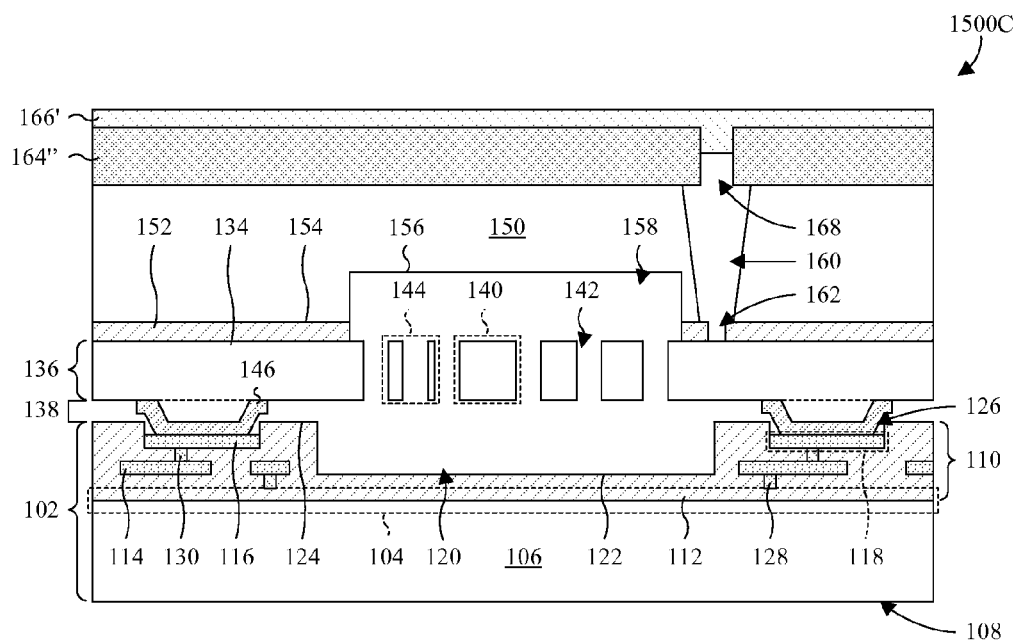

FIG. 15C illustrates a cross-sectional view 1500C of some embodiments corresponding to Act 320. As illustrated, a seal layer 166' is formed over the mask layer 164" and the mask opening 168 at a target pressure, thereby sealing the capping cavity 158 (and, in some embodiments, the IC cavity 120) at the target pressure. The seal layer 166' is formed with a thickness that is typically no less than half the mask opening top width. In some embodiments, the seal layer thickness is formed at about 0.25 micrometers to about 2.5 micrometers. Further, the seal layer 166' is formed at least partially filling the mask opening 168. The depth to which the seal layer 166' fills the mask opening 168 depends upon the mask opening top width and the seal layer thickness. The seal layer 166' may be formed using vapor deposition, thermal oxidation, spin coating, or any other suitable deposition technique, depending upon the target pressure. For a target pressure less than a millibar, a sputter deposition may be used. For a target pressure between about 0.1 torr to about 100 torr, a sub-atmospheric CVD (SACVD) may be used. For a target pressure less than a standard atmosphere (atm), atmospheric pressure CVD (APCVD) may be used.

Figure 15D:
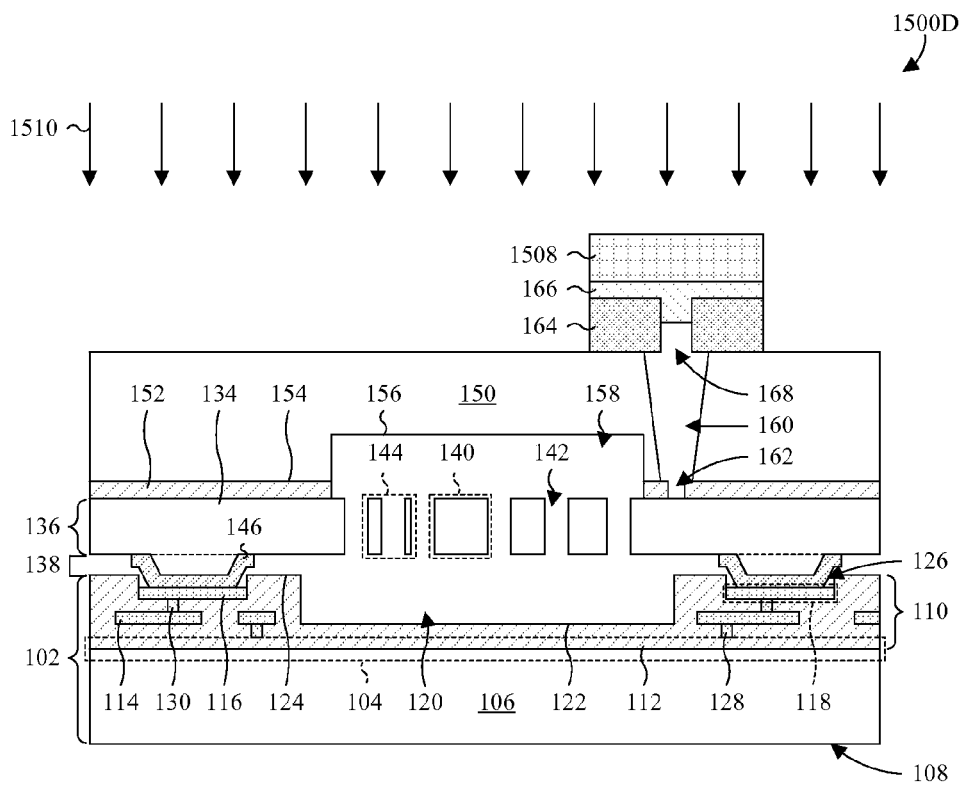

FIG. 15D illustrates a cross-sectional view 1500D of some embodiments corresponding to Act 322. As illustrated, an eighth etch is performed into the mask and seal layers 164", 166' (see FIG. 15C), through select regions laterally surrounding the seal opening 160, to remove the select regions. The process for performing the eighth etch may include forming a seventh photoresist layer 1508 masking the seal opening 160 and laterally surrounding the select regions. Further, one or more etchants 1510 may be applied to the mask and seal layers 164", 166' according to a pattern of the seventh photoresist layer 1508. Thereafter, the seventh photoresist layer 1508 may be removed.

FIGS. 16A-D illustrate alternative cross-sectional views 1600A-D of some embodiments corresponding to Acts 316-322. The cross-sectional views 1600A-D illustrate the formation of MEMS structures according to FIGS. 2A-C, in which a seal opening is in indirect fluid communication with a cavity being sealed.

Figure 16A:
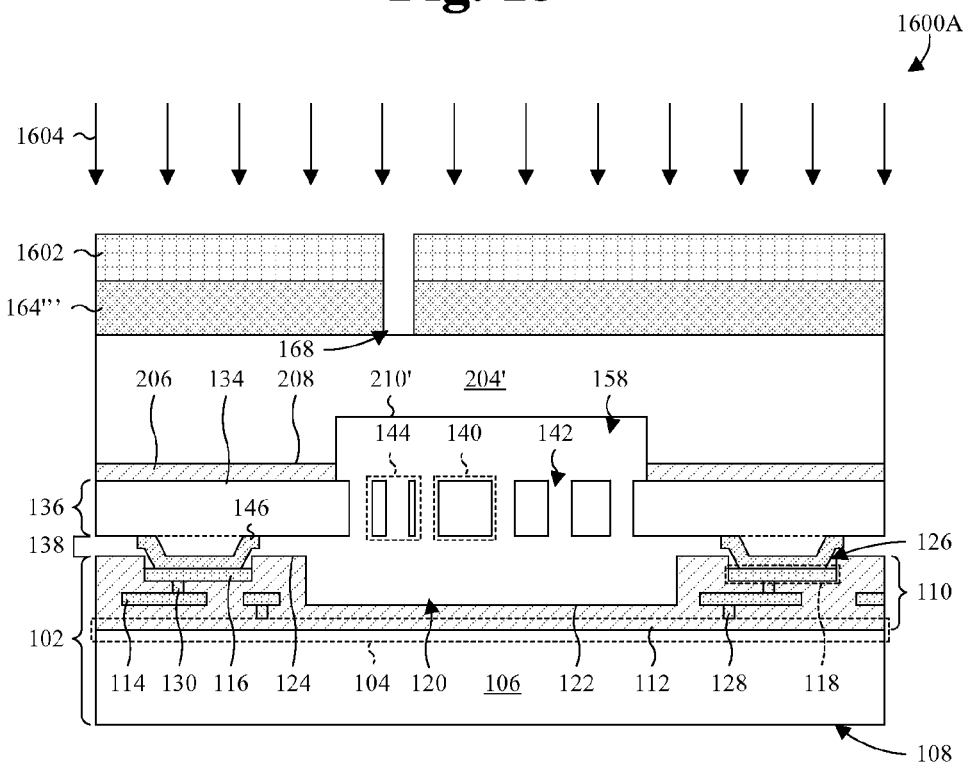

FIG. 16A illustrates a cross-sectional view 1600A of some embodiments corresponding to Act 316. As illustrated, a sixth etch is performed into the mask layer 164' (see FIG. 14), through a select region of the mask layer 164' overlying the capping cavity 158. The sixth etch results in a remaining mask layer 164''' with a mask opening 168 exposing a seal opening region of a capping substrate 204' that overlies the capping cavity 158. The capping substrate 204' has a first surface 208 laterally surrounding the capping cavity 158, and lined by a capping dielectric layer 206 without a trench. Further, the capping substrate 204' has a second surface 210' overlying the capping cavity 158 and recessed relative to the first surface 208. The process for performing the sixth etch may include forming a sixth photoresist layer 1602 masking regions of the mask layer 164' that laterally surrounding the seal opening region. Further, an etchant 1604 may be applied to the mask layer 164' according to a pattern of the sixth photoresist layer 1602. Thereafter, the sixth photoresist layer 1602 may be removed.

Figure 16B:
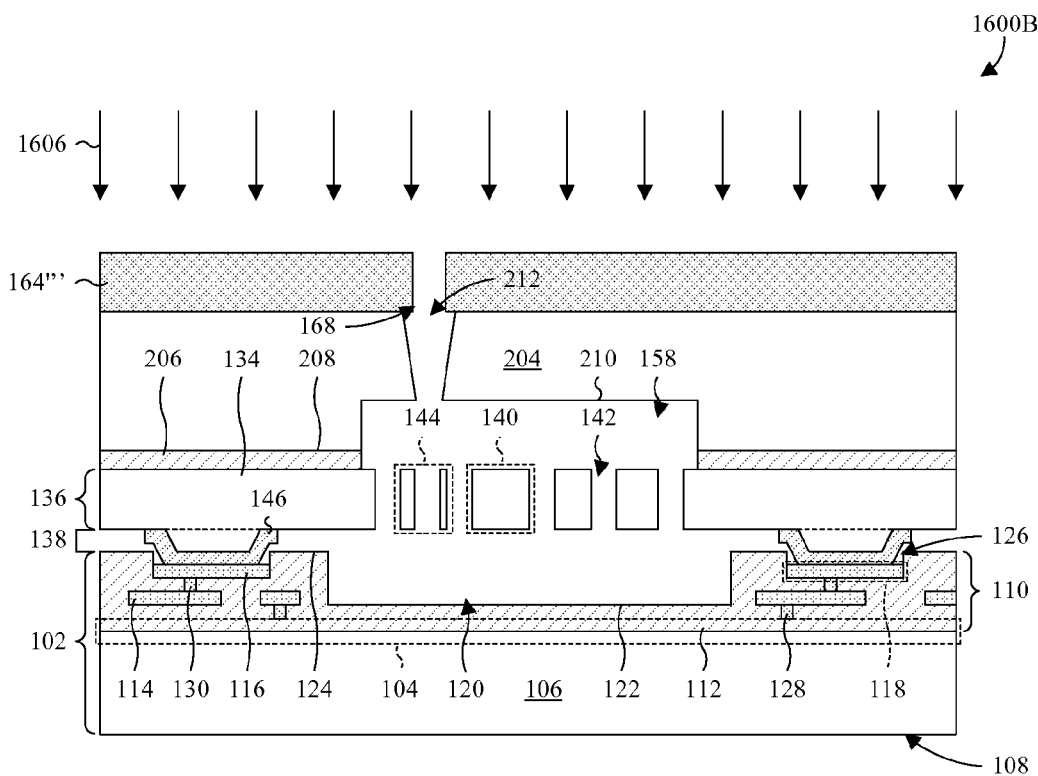

FIG. 16B illustrates a cross-sectional view 1600B of some embodiments corresponding to Act 318. As illustrated, a seventh etch is performed into the capping substrate 204' (see FIG. 16A), through the seal opening region, to expose the capping cavity 158 (and, in some embodiments, the IC cavity 120). The seventh etch results in a remaining capping substrate 204 with a seal opening 212 overlying and exposing the capping cavity 158. The seal opening 212 is formed with a width tapering from a top width of the seal opening 212. The seal opening top width is formed greater than the mask opening bottom width, such that the mask layer 164''' overhangs the seal opening 212. The process for performing the seventh etch may include applying an etchant 1606 to the capping substrate 204' according to a pattern of the mask layer 164''' and through the mask opening 168.

Figure 16C:
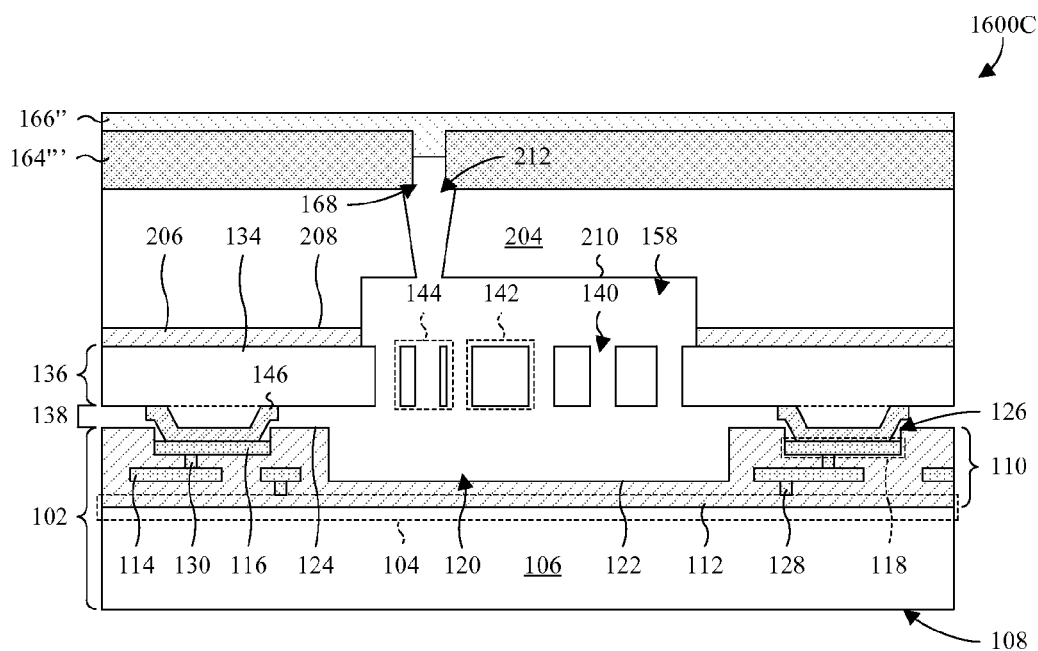

FIG. 16C illustrates a cross-sectional view 1600C of some embodiments corresponding to Act 320. As illustrated, a seal layer 166" is formed over the mask layer 164''' and the mask opening 168 at a target pressure, thereby sealing the capping cavity 158 (and, in some embodiments, the IC cavity 120) at the target pressure. The seal layer 166" is formed with a thickness that is typically no less than half the mask opening top width. Further, the seal layer 166" is formed at least partially filling the mask opening 168. The seal layer 166' may be formed using vapor deposition, thermal oxidation, spin coating, or any other suitable deposition technique, depending upon the target pressure. For example, a sputter deposition, SACVD, and APCVD may be respectively used for a target pressure less than a millibar, a target pressure between about 0.1 torr to about 100 torr, and a target pressure less than an atm.

Figure 16D:
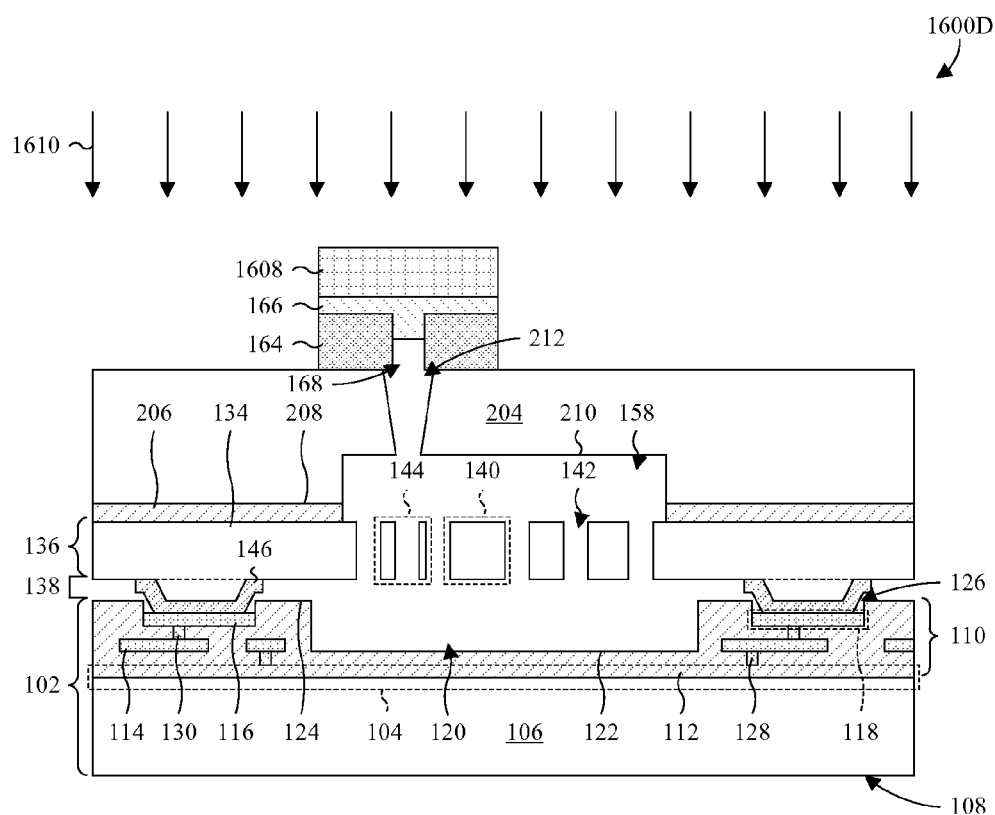

FIG. 16D illustrates a cross-sectional view 1600D of some embodiments corresponding to Act 322. As illustrated, an eighth etch is performed into the mask and seal layers 164''', 166" (see FIG. 16C), through select regions laterally surrounding the seal opening 212, to remove the select regions. The process for performing the eighth etch may include forming a seventh photoresist layer 1608 masking the seal opening 212 and laterally surrounding the select regions. Further, one or more etchants 1610 may be applied to the mask and seal layers 164''', 166" according to a pattern of the seventh photoresist layer 1608. Thereafter, the seventh photoresist layer 1608 may be removed.

Thus, as can be appreciated from above, the present disclosure provides a MEMS structure. A MEMS substrate comprises a movable element, and a capping substrate is arranged over the MEMS substrate. The capping substrate comprises a cavity arranged over and opening to the movable element, and the capping substrate comprises a seal opening in fluid communication with the cavity. A mask layer is arranged over the capping substrate. The mask layer overhangs the seal opening and laterally surrounds a mask opening arranged over the seal opening. A seal layer is arranged over the mask layer and the mask opening. The seal layer is configured to hermetically seal the cavity.

In other embodiments, the present disclosure provides a method for manufacturing a MEMS structure. A capping substrate arranged over a MEMS substrate is provided. The capping substrate comprises a cavity opening to the MEMS substrate. A mask layer is formed over the capping substrate. A first etch is performed into the mask layer to form a mask opening exposing a select region of the capping substrate. A second etch is performed into the capping substrate, through the mask opening, to form a seal opening. The seal opening is formed in fluid communication with the cavity, and the seal opening is formed with a top width exceeding a bottom width of the mask opening. A seal layer is formed over the mask opening at a target pressure to hermetically seal the cavity with the target pressure.

In yet other embodiments, the present disclosure provides a MEMS structure. A MEMS substrate comprises a movable element. An IC is arranged under and bonded to a lower side of the MEMS substrate. The IC includes an IC cavity opening to the movable element. A capping substrate is arranged over and bonded to an upper side of the MEMS substrate. The capping substrate comprises a capping cavity opening to the movable element. The capping substrate comprises a seal opening in fluid communication with the capping cavity, and the seal opening has a ratio of height to top width that is at least about 30 to 1. A mask layer is arranged over the capping substrate. The mask layer overhangs the seal opening and laterally surrounds a mask opening arranged over the seal opening. A seal layer is arranged over the mask layer and the mask opening. The seal layer partially fills the mask opening and is configured to hermetically seal the capping cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microelectromechanical systems (MEMS) structure comprising:
    a MEMS substrate with a movable element;
    a capping substrate arranged over the MEMS substrate, wherein the capping substrate includes a cavity arranged over and opening to the movable element, and wherein the capping substrate includes a seal opening in fluid communication with the cavity;
    a mask layer arranged over and contacting a top surface of the capping substrate, wherein the mask layer overhangs the seal opening and defines a mask opening, wherein the mask opening is arranged directly over the seal opening and has a width less than a topmost width of the seal opening, and wherein the mask layer is entirely over the top surface of the capping substrate; and
    a seal layer arranged over the mask layer and the mask opening, wherein the seal layer is configured to hermetically seal the cavity.

2. The MEMS structure according to claim 1, wherein the seal opening is arranged laterally adjacent to the cavity and in indirect fluid communication with the cavity.

3. The MEMS structure according to claim 2, further including:
    a capping dielectric layer arranged between the MEMS substrate and the capping substrate, wherein the capping dielectric layer includes a trench extending laterally to and opening into the cavity from a point that is laterally adjacent to the cavity and that is directly under the seal opening.

4. The MEMS structure according to claim 1, wherein the seal layer has a thickness that is at least about half of a top width of the mask opening.

5. The MEMS structure according to claim 1, wherein the seal layer partially fills the mask opening to a depth of about 0.5 micrometers to about 5.0 micrometers.

6. The MEMS structure according to claim 1, wherein the mask layer includes an oxide, and wherein the capping substrate is a single, semiconductor material of silicon.

7. The MEMS structure according to claim 1, further including:
    an integrated circuit (IC) arranged under the MEMS substrate, wherein the IC includes an additional cavity arranged under and opening to the movable element.

8. A microelectromechanical systems (MEMS) structure comprising:
    a MEMS substrate having a movable element;
    an integrated circuit (IC) arranged under and bonded to a lower side of the MEMS substrate, wherein the IC includes an IC cavity opening to the movable element;
    a capping substrate arranged over and bonded to an upper side of the MEMS substrate, wherein the capping substrate includes a capping cavity opening to the movable element, wherein the capping substrate includes a seal opening in fluid communication with the capping cavity, wherein the seal opening has a ratio of height to top width that is at least about 30 to 1, and wherein the seal opening is arranged laterally adjacent to the capping cavity and in indirect fluid communication with the capping cavity;
    a mask layer arranged over the capping substrate, wherein the mask layer overhangs the seal opening and laterally surrounds a mask opening arranged over the seal opening;
    a seal layer arranged over the mask layer and the mask opening, wherein the seal layer partially fills the mask opening and is configured to hermetically seal the capping cavity; and
    a capping dielectric layer arranged between the MEMS substrate and the capping substrate, wherein the capping dielectric layer includes a trench extending laterally to the capping cavity from a point that is laterally adjacent to the capping cavity and that is under the seal opening.

9. The MEMS structure according to claim 8, wherein the capping dielectric layer directly contacts the MEMS substrate and the capping substrate.

10. The MEMS structure according to claim 8, wherein a top surface of the IC comprises an IC opening laterally enclosing the IC cavity, wherein the MEMS substrate comprises a downward protrusion laterally enclosing the movable element and arranged in the IC opening, and wherein the MEMS structure further comprises:
    a first conductive bond ring arranged in the IC opening; and a second conductive bond ring lining the downward protrusion, wherein the first conductive bond ring and the second conductive bond ring interface at a eutectic bond interface between the IC and the MEMS substrate.

11. A microelectromechanical systems (MEMS) structure comprising:
a first substrate arranged over a second substrate and arranged under a third substrate, wherein the first substrate comprises a movable element arranged in a cavity defined between the second and third substrates, wherein the third substrate comprises a first opening in fluid communication with the cavity, and wherein the third substrate has a pair of opposing sidewalls that define sidewalls of the first opening;
a mask layer arranged over the third substrate and defining a second opening, wherein the second opening is arranged directly over the first opening and extends continuously respectively from and to opposing sidewalls of the mask layer, such that the mask layer overhangs the first opening, wherein a bottommost edge of the mask layer is laterally spaced between the opposing sidewalls of the third substrate; and
a seal layer arranged over and independent of the mask layer, wherein a lower surface of the seal layer is arranged in the second opening and spaced over a bottom surface of the mask layer, and wherein the seal layer laterally contacts the opposing sidewalls of the mask layer.

12. The MEMS structure according to claim 11, further comprising:
a dielectric layer contacting and spacing a bottom surface of the third substrate from a top surface of the first substrate, wherein the dielectric layer contacts the top surface and comprises a trench extending laterally to the cavity from a point that is laterally adjacent to the cavity and that is directly under the first and second openings, and wherein the first opening is in fluid communication with the cavity through the trench.

13. The MEMS structure according to claim 11, further comprising an interlayer dielectric (ILD) layer arranged over the second substrate, between the first and second substrates, wherein a top surface of the ILD layer comprises a third opening laterally enclosing the cavity, and wherein the first substrate comprises a downward protrusion laterally enclosing the cavity and arranged in the third opening.

14. The MEMS structure according to claim 11, wherein the first and second openings have respective width-wise centers that are aligned, and wherein the first opening tapers from a top width that is greater than that of the second opening.

15. The MEMS structure according to claim 1, wherein the top surface of the capping substrate is planar, and wherein a bottom surface of the mask layer is planar and over the top surface of the capping substrate.

16. The MEMS structure according to claim 3, wherein the trench extends sideways from the point to the cavity, wherein a bottom surface of the trench and a top surface of the trench are respectively defined by a top surface of the MEMS substrate and a bottom surface of the capping substrate, and wherein sidewalls of the trench are respectively defined by sidewalls of the capping dielectric layer.

17. The MEMS structure according to claim 8, wherein the capping substrate includes a recessed surface that is vertically spaced between a bottom surface of the capping substrate and a top surface of the capping substrate, wherein the recessed surface defines a top surface of the capping cavity, wherein the mask layer contacts the top surface of the capping substrate, and wherein the sealing opening extends continuously from the top surface of the capping substrate to the bottom surface of the capping substrate.

18. The MEMS structure according to claim 8, wherein a bottommost point of the mask layer is over a topmost point of the capping substrate.

19. The MEMS structure according to claim 1, wherein the seal opening extends continuously, at an interface at which the mask layer and the capping substrate contact, respectively from and to opposing sidewalls of the capping substrate, and wherein a bottommost point of the mask layer is over a topmost edge of the opposing sidewalls.

* * * * *